(12) United States Patent
Chen et al.

(10) Patent No.: US 10,672,754 B2
(45) Date of Patent: Jun. 2, 2020

(54) SEMICONDUCTOR COMPONENT, PACKAGE STRUCTURE AND MANUFACTURING METHOD THEREOF

(71) Applicant: Taiwan Semiconductor Manufacturing Co., Ltd., Hsinchu (TW)

(72) Inventors: Ming-Fa Chen, Taichung (TW); Hsien-Wei Chen, Hsinchu (TW); Sung-Feng Yeh, Taipei (TW); Chi-Hwang Tai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/436,866

(22) Filed: Jun. 10, 2019

(65) Prior Publication Data
US 2019/0312022 A1    Oct. 10, 2019

Related U.S. Application Data

(63) Continuation of application No. 15/717,920, filed on Sep. 27, 2017, now Pat. No. 10,319,707.

(51) Int. Cl.
*H01L 25/00* (2006.01)
*H01L 23/00* (2006.01)
(Continued)

(52) U.S. Cl.
CPC .......... *H01L 25/50* (2013.01); *H01L 21/6835* (2013.01); *H01L 21/6836* (2013.01); *H01L 23/544* (2013.01); *H01L 24/02* (2013.01);

*H01L 24/19* (2013.01); *H01L 24/20* (2013.01); *H01L 24/24* (2013.01); *H01L 24/25* (2013.01); *H01L 24/29* (2013.01); *H01L 24/32* (2013.01);
(Continued)

(58) Field of Classification Search
CPC .. H01L 25/50; H01L 21/6835; H01L 21/6836
See application file for complete search history.

(56) References Cited

U.S. PATENT DOCUMENTS 8,039,315 B2 * 10/2011 Lee .......................... H01L 21/56
257/E21.499
9,000,584 B2    4/2015 Lin et al.
(Continued)

*Primary Examiner* — Marc Anthony Armand
(74) *Attorney, Agent, or Firm* — JCIPRNET

(57) ABSTRACT

A package manufacturing having a semiconductor substrate, a bonding layer, at least one semiconductor device, a redistribution circuit structure and an insulating encapsulation. The bonding layer is disposed on the semiconductor substrate. The semiconductor device is disposed on and in contact with a portion of the bonding layer, wherein the bonding layer is located between the semiconductor substrate and the semiconductor device and adheres the semiconductor device onto the semiconductor substrate. The redistribution circuit structure is disposed on and electrically connected to the semiconductor device, wherein the semiconductor device is located between the redistribution circuit structure and the bonding layer. The insulating encapsulation wraps a sidewall of the semiconductor device, wherein a sidewall of the bonding layer is aligned with a sidewall of the insulating encapsulation and a sidewall of the redistribution circuit structure.

20 Claims, 15 Drawing Sheets

(51) Int. Cl.
 H01L 21/683 (2006.01)
 H01L 25/065 (2006.01)
 H01L 25/18 (2006.01)
 H01L 23/544 (2006.01)
 H01L 21/56 (2006.01)
 H01L 23/31 (2006.01)
(52) U.S. Cl.
 CPC .............. *H01L 24/73* (2013.01); *H01L 24/83* (2013.01); *H01L 25/0652* (2013.01); *H01L 25/18* (2013.01); *H01L 21/561* (2013.01); *H01L 23/3128* (2013.01); *H01L 2221/68327* (2013.01); *H01L 2221/68345* (2013.01); *H01L 2221/68359* (2013.01); *H01L 2221/68368* (2013.01); *H01L 2223/54426* (2013.01); *H01L 2224/02331* (2013.01); *H01L 2224/24101* (2013.01); *H01L 2224/24137* (2013.01); *H01L 2224/25171* (2013.01); *H01L 2224/29188* (2013.01); *H01L 2224/32145* (2013.01); *H01L 2224/73209* (2013.01); *H01L 2224/73267* (2013.01); *H01L 2224/8313* (2013.01); *H01L 2224/83896* (2013.01); *H01L 2924/1203* (2013.01); *H01L 2924/1304* (2013.01); *H01L 2924/1433* (2013.01); *H01L 2924/1461* (2013.01)

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2011/0198762 | A1* | 8/2011 | Scanlan ............ H01L 23/3128 257/793 |
| 2012/0028411 | A1* | 2/2012 | Yu .................... H01L 21/561 438/107 |
| 2012/0241941 | A1* | 9/2012 | Kim .................. H01L 23/367 257/712 |

* cited by examiner

SEMICONDUCTOR COMPONENT, PACKAGE STRUCTURE AND MANUFACTURING METHOD THEREOF

CROSS-REFERENCE TO RELATED APPLICATION

This application is a continuation application of and claims the priority benefit of a prior application Ser. No. 15/717,920, filed on Sep. 27, 2017, now allowed. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
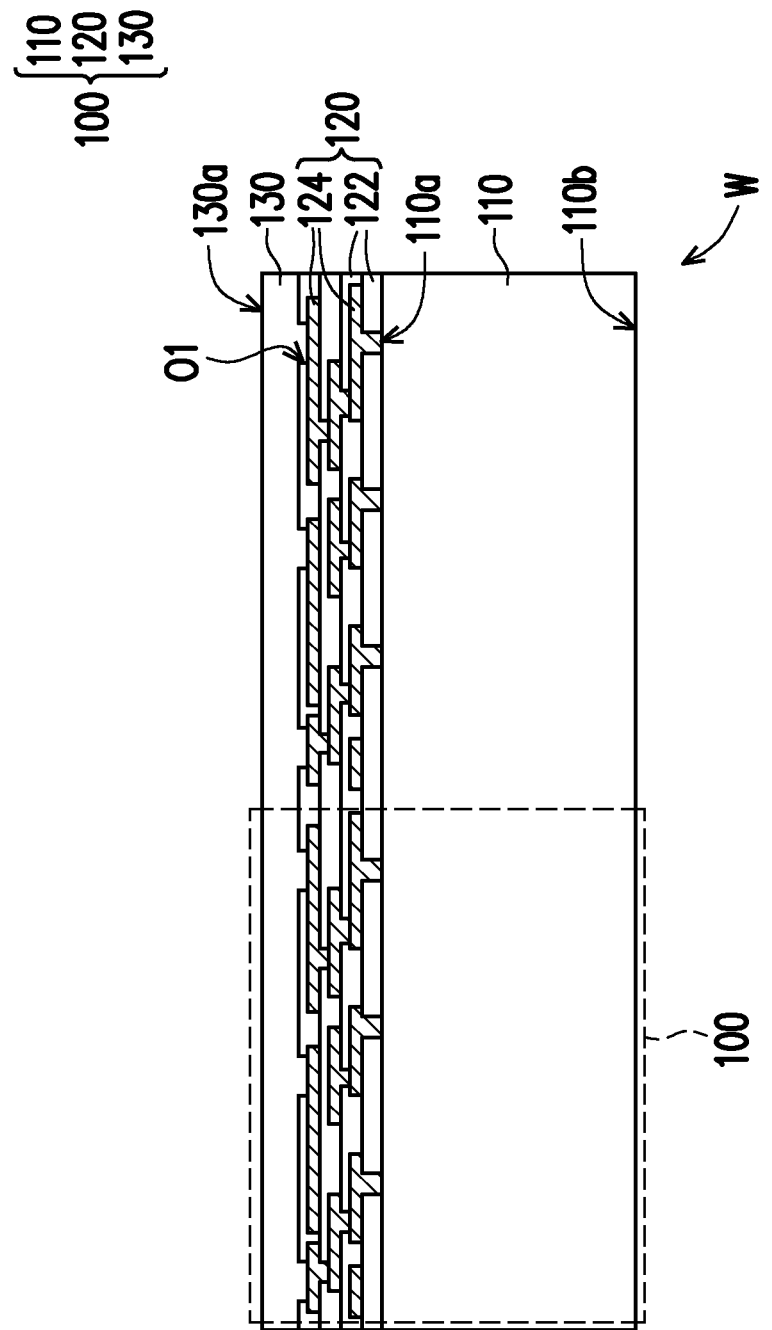
FIG. 1A to FIG. 1G are schematic cross sectional views of various stages in a method of manufacturing semiconductor components according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross sectional views of various stages in a method of manufacturing semiconductor components according to some exemplary embodiments of the present disclosure. In exemplary embodiments, the manufacturing method is part of a packaging process at a wafer level, and a semiconductor component 100a is shown to represent a semiconductor component obtained following the manufacturing method, for example. In some embodiments, two semiconductor components or chips are shown to represent plural devices or chips of a wafer, the disclosure is not limited thereto.

Referring to FIG. 1A, in some embodiments, a wafer W including a plurality of integrated circuit components 100 arranged in an array is provided. Before performing a wafer sawing or dicing process on the wafer W, the integrated circuit components 100 of the wafer W are connected one another, as shown in FIG. 1A. In some embodiments, each of the integrated circuit components 100 includes a semiconductor substrate 110, an interconnection structure 120 disposed on the semiconductor substrate 110 and a passivation layer 130 covering the interconnection structure 120. As shown in FIG. 1A, the semiconductor substrate 110 has a top surface 110a and a bottom surface 110b opposite to the top surface 110a, and the interconnection structure 120 is located between the top surface 110a of the semiconductor substrate 110 and the passivation layer 130, for example.

In some embodiments, the semiconductor substrate 110 may be a silicon substrate including active components (e.g., transistors or the like) and/or passive components (e.g., resistors, capacitors, inductors or the like) formed therein. The disclosure is not limited thereto.

In some embodiments, the interconnection structure 120 may include one or more inter-dielectric layers 122 and one or more patterned conductive layers 124 stacked alternately. For examples, the inter-dielectric layers 122 may be silicon oxide layers, silicon nitride layers, silicon oxy-nitride layers, or dielectric layers formed by other suitable dielectric materials, and the inter-dielectric layers 122 may be formed by deposition or the like. For examples, the patterned conductive layers 124 may be patterned copper layers or other suitable patterned metal layers, and the patterned conductive layers 124 may be formed by electroplating or deposition. However, the disclosure is not limited thereto. In some embodiments, the patterned conductive layers 124 may be formed by dual-damascene method. The numbers of the layers of the inter-dielectric layers 122 and the patterned conductive layers 124 may be less than or more than what is depicted in FIG. 1A, and may be designated based on the demand and/or design layout; the disclosure is not specifically limited thereto.

In certain embodiments, as shown in FIG. 1A, the patterned conductive layers 124 are sandwiched between the inter-dielectric layers 122, where a top surface of the topmost layer of the patterned conductive layers 124 is at least partially exposed by a plurality of first openings O1 formed in the topmost layer of the inter-dielectric layers 122 to connect to later formed component(s) for electrical connection, and a bottom surface of the lowest layer of the patterned conductive layers 124 is at least partially exposed by a plurality of second openings (no marked) formed in the lowest layer of the inter-dielectric layers 122 and electrically connected to the active components and/or passive components included in the semiconductor substrate 110. The shapes and numbers of the first openings O1 and the second openings are not limited in the disclosure, and may be designated based on the demand and/or design layout.

The disclosure is not limited thereto. In an alternative embodiment (not shown), the patterned conductive layers 124 may be sandwiched between the inter-dielectric layers 122, where a top surface of the topmost layer of the patterned conductive layers 124 may be entirely covered by the inter-dielectric layers 122 for preventing damages caused by subsequent process(es), and a bottom surface of the lowest layer of the patterned conductive layers 124 may be at least partially exposed by openings formed in the lowest layer of the inter-dielectric layers 122 and electrically connected to the underlying active components and/or passive components. Through patterning processes, the top surface of the topmost layer of the patterned conductive layers 124 covered by the topmost layer of the inter-dielectric layers 122 may be exposed for electrical connection to later formed component(s) overlaid thereon, for example.

Continued on FIG. 1A, in some embodiments, the passivation layer 130 is formed on the interconnection structure 120, where the interconnection structure 120 is covered by and in contact with the passivation layer 130. As shown in FIG. 1A, the passivation layer 130 has a substantially planar surface 130a, for example. In certain embodiments, the surface 130a of the passivation layer 130 may be levelled and may have a high degree of planarity and flatness, which is beneficial for the later-formed layers. In some embodiments, the passivation layer 130 may be a polyimide (PI) layer, a polybenzoxazole (PBO) layer, a silicon dioxide based (non-organic) layer or other suitable polymer (or organic) layer, and may be formed by deposition or the like. The disclosure is not limited thereto. In some embodiments, the passivation layer 130 entirely covers the topmost layer of the patterned conductive layers 124 and the topmost layer of the inter-dielectric layers 122, where the interconnection structure 120 is well-protected by the passivation layer 130 from damages caused by subsequent process(es). As shown in FIG. 1A, the interconnection structure 120 is located between the top surface 110a of the semiconductor substrate 110 and the passivation layer 130, for example. The disclosure does not specifically limit a thickness of the passivation layer 130 as long as the surface 130a of the passivation layer 130 can maintain its high degree of planarity and flatness.

Figure 1B:
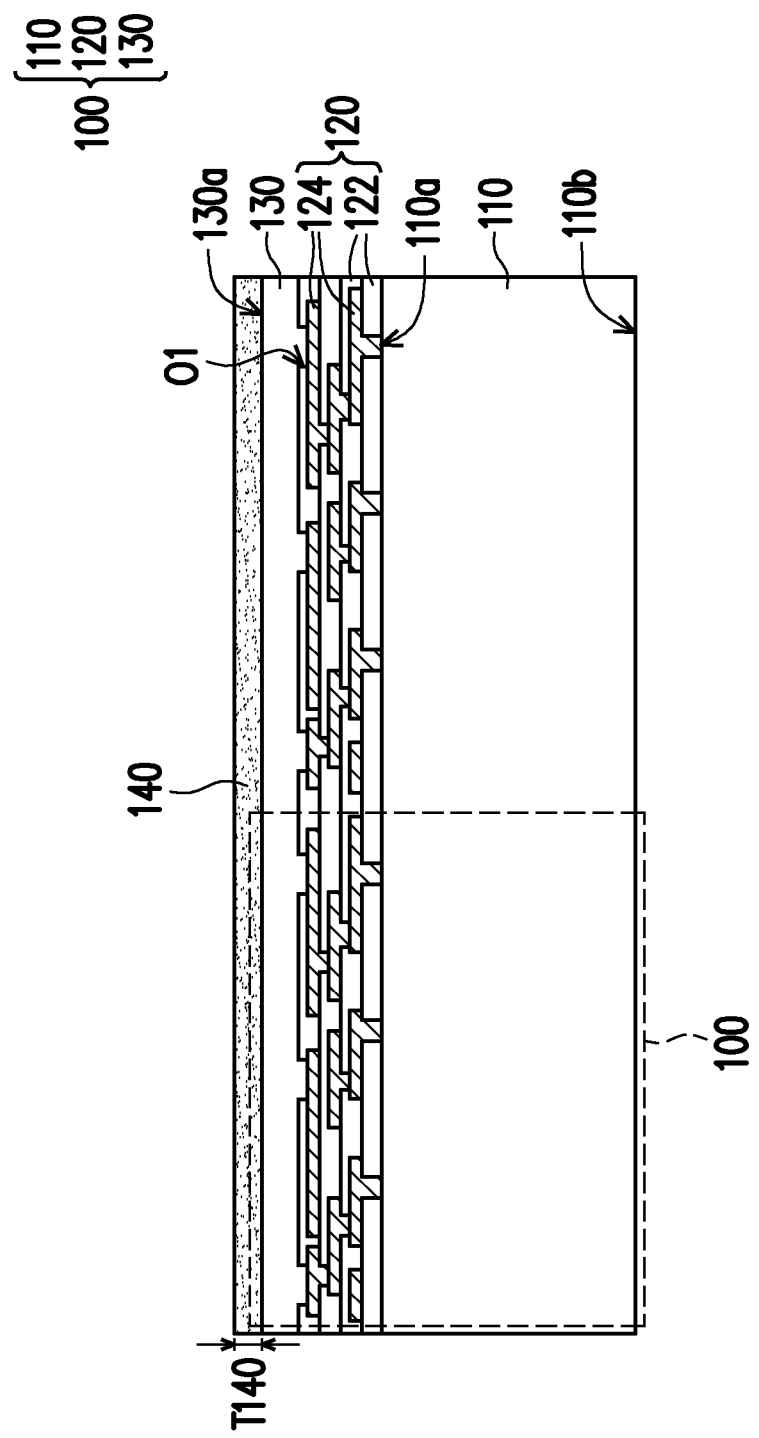

Referring to FIG. 1B, in some embodiments, a bonding layer 140 is formed over on the passivation layer 130. As shown in FIG. 1B, the bonding layer 140 is a smooth layer having a continuous even surface and overlaid on the surface 130a of the passivation layer 130, for example. In some embodiments, the bonding layer 140 is formed in a form of a blanket layer covering the passivation layer 130 (e.g. on the surface 130a) and disposed thereon. In certain embodiments, as shown in FIG. 1B, the bonding layer 140 entirely covers the surface 130a of the passivation layer 130. In some embodiments, a material of the bonding layer 140 may be made of silicon oxynitride (SiON), and may be formed by deposition or the like. In an alternative embodiment, the material of the bonding layer 140 may be made of silicon oxide, silicon nitride or the like. In some embodiments, a thickness T140 of the bonding layer 140 may approximately range from about 100 Å to about 100 kÅ. Due to the surface 130a of the passivation layer 130 has the high degree of planarity and flatness, the bonding layer 140 is capable of having a substantially uniform and even thickness.

Figure 1C:
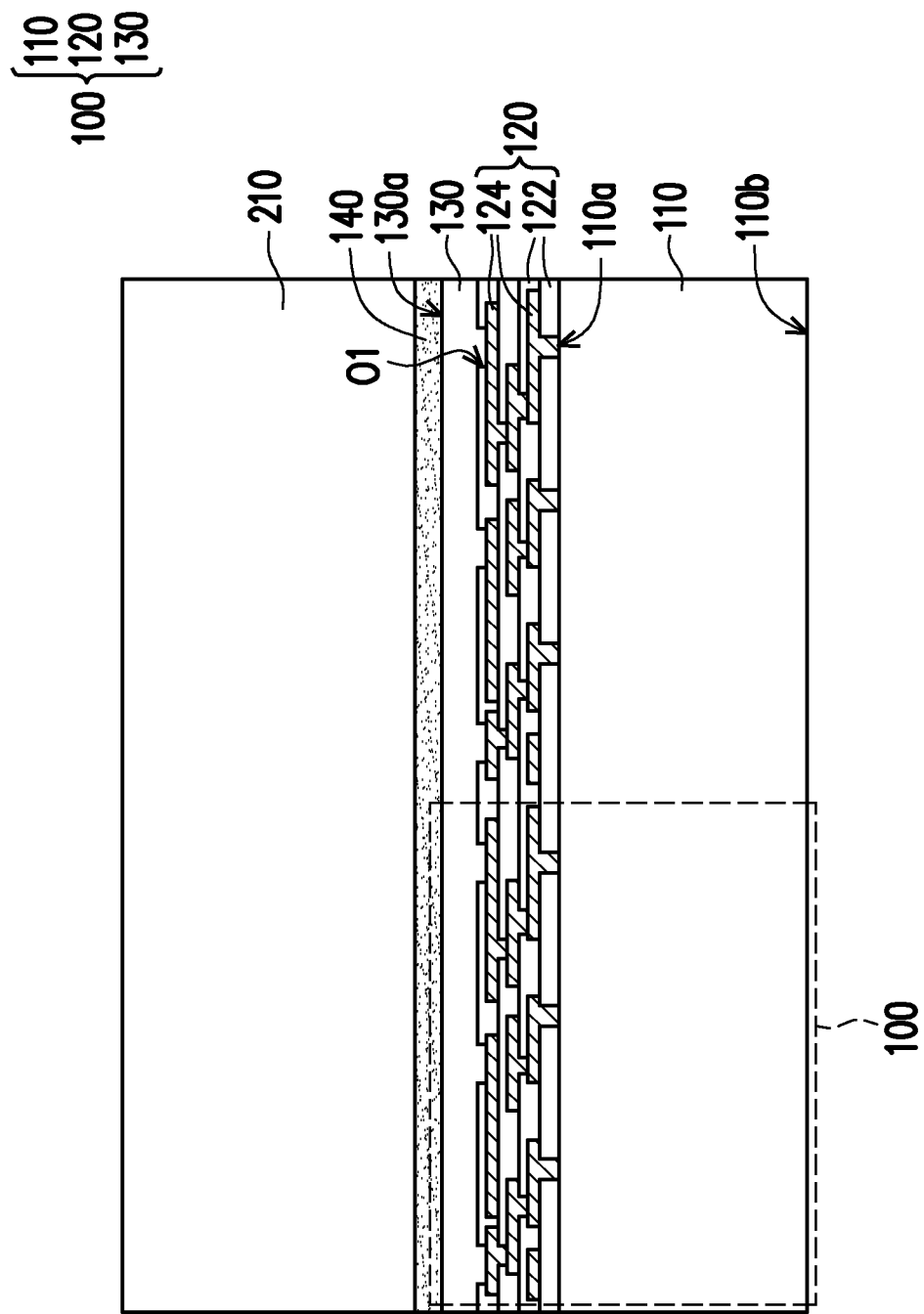

Referring to FIG. 1C, in some embodiments, a semiconductor substrate 210 is provided, and is disposed on the bonding layer 140. As shown in FIG. 1C, the bonding layer 140 is located between the semiconductor substrate 210 and the integrated circuit components 100 (e.g. the passivation layer 130), for example. In certain embodiments, through the bonding layer 140, the semiconductor substrate 210 is bonded to the integrated circuit components 100 by fusion bonding. For example, the fusion bonding process may include a hydrophilic fusion bonding process, where a workable temperature is approximately greater than or substantially equal to about 100° C. and a workable pressure is approximately greater than or substantially equal to about 1 kg/cm$^2$; however, the disclosure is not specifically limited thereto. In some embodiments, the semiconductor substrate 210 may be a reclaim silicon substrate or the like, and thus the manufacturing cost is reduced.

In certain embodiments, to facilitate the forgoing processes depicted in FIG. 1A to FIG. 1C, the semiconductor substrate 110 may be temporarily adhered with a support (not shown) via the adhesion film (not shown). However, the disclosure is not limited thereto. In one embodiment, as a thickness of the semiconductor substrate 110 is thick enough to perform the forgoing processes depicted in FIG. 1A to FIG. 1C without generating damages (e.g. cracks, or broken wafer), the semiconductor substrate 110 may not necessarily be temporarily adhered with the support.

Figure 1D:
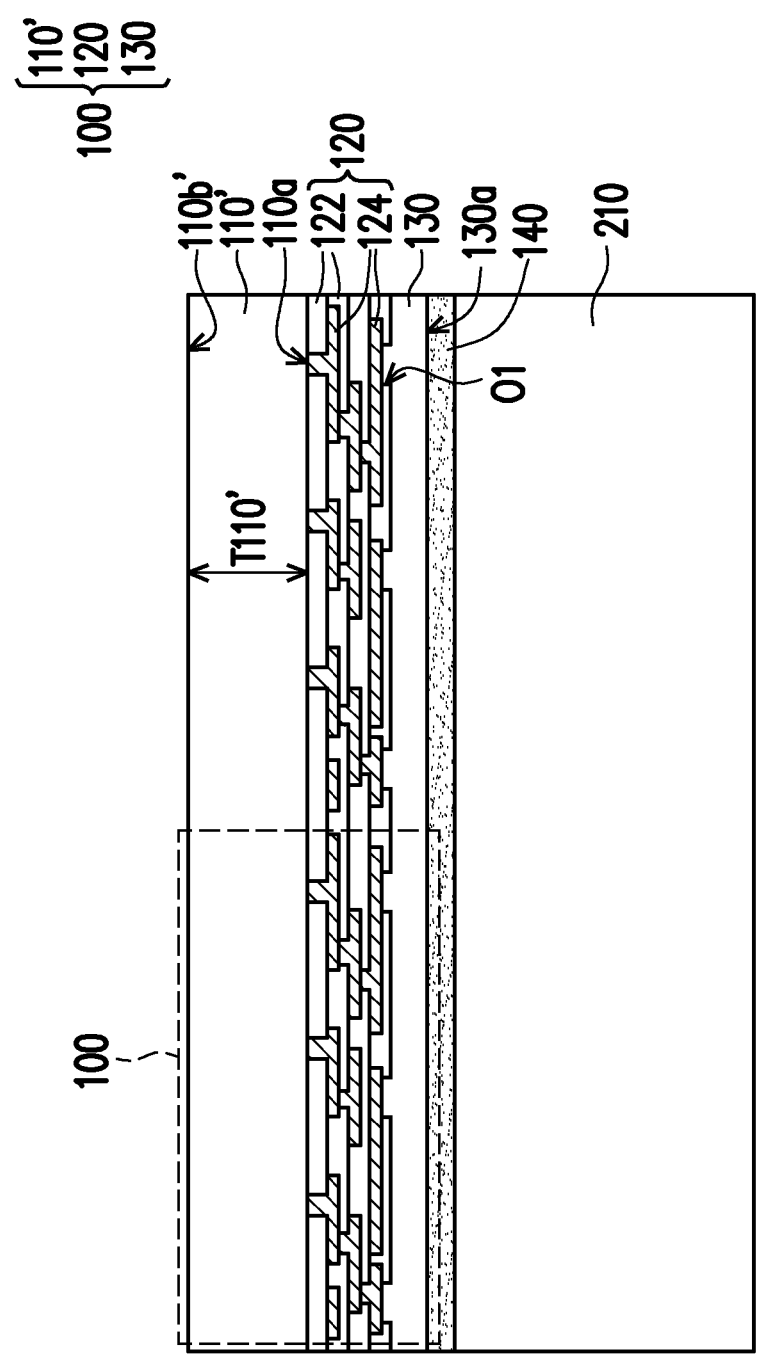

Referring to FIG. 1D, in some embodiments, a planarizing step is performed on the bottom surface 110b of the semiconductor substrate 110 to form a planarized semiconductor substrate 110'. The planarized semiconductor substrate 110' is also referred as a thin semiconductor substrate 110'. In some embodiments, a thickness T110' of the planarized semiconductor substrate 110' may approximately range from about 3 μm to about 30 μm. In some embodiments, the planarizing step may include a grinding process or a chemical mechanical polishing (CMP) process or a grinding process. After the planarizing step, a cleaning step may be optionally performed, for example to clean and remove the residue generated from the planarizing step. However, the disclosure is not limited thereto, and the planarizing step may be performed through any other suitable method. In one embodiment, a surface treatment may be performed on the planarized bottom surface 110b' of semiconductor substrate 110; however, the disclosure is not limited thereto. In some embodiments, the surface treatment may be performed by plasma treatment with $N_2$, $O_2$, Ar, or the like. The disclosure is not limited thereto. In an alternative embodiment, no surface treatment may be performed on the planarized bottom surface 110b' of semiconductor substrate 110.

In certain embodiments, to facilitate the forgoing process depicted in FIG. 1D, the semiconductor substrate 110 may be released from the support (not shown) by debonding the semiconductor substrate 110 from the adhesion film (not shown), and then the semiconductor substrate 210 may be temporarily adhered with another support (not shown) via the adhesion film (not shown) or be temporarily adhered with a temporary carrier (not shown, such as an adhesive tape, an adhesive carrier, a suction pad, etc.). However, the disclosure is not limited thereto. In one embodiment, as a thickness of the semiconductor substrate 210 is thick enough to perform the forgoing process depicted in FIG. 1D without generating damages (e.g. cracks or broken wafer), the semiconductor substrate 210 may not necessarily be temporarily adhered with the support.

Figure 1E:
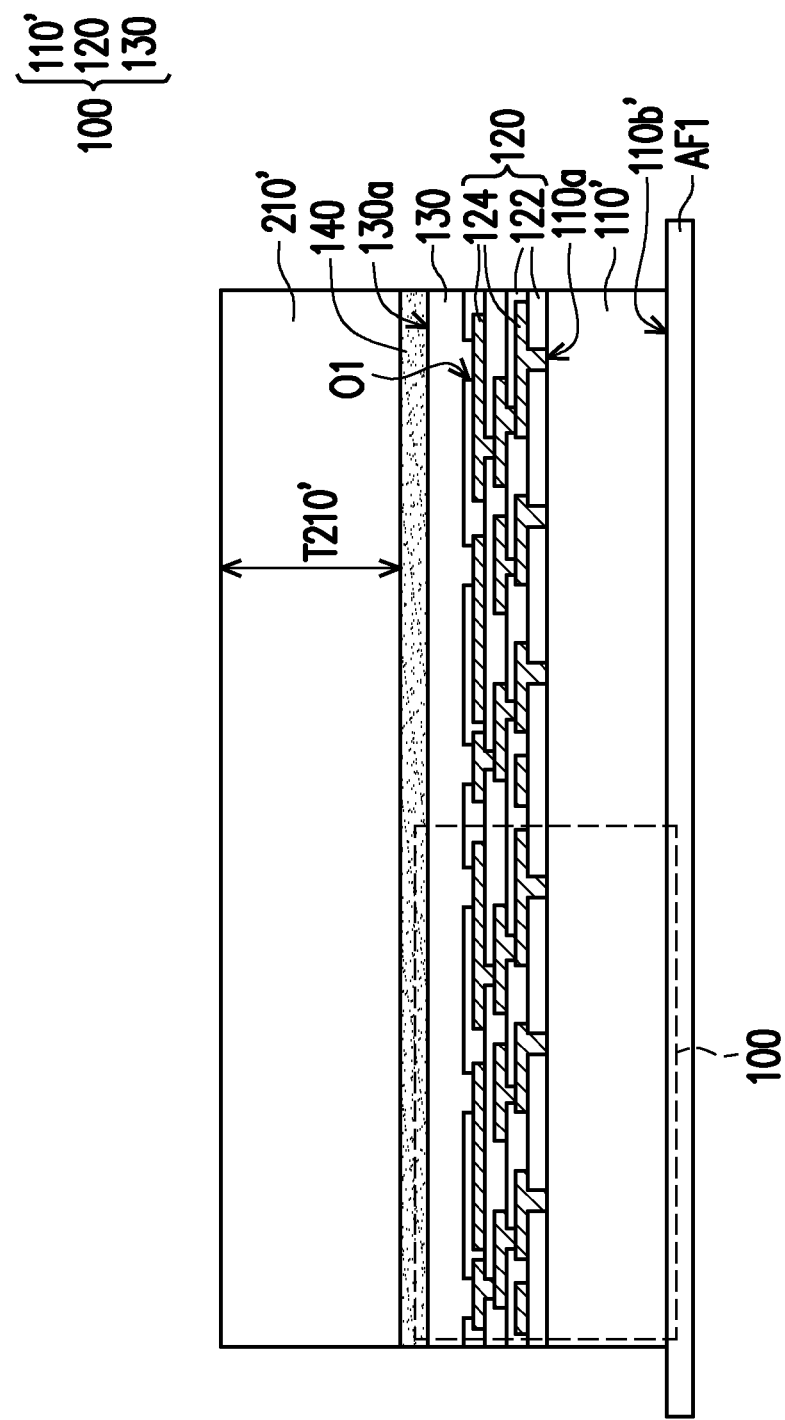

Referring to FIG. 1E, in some embodiments, a planarizing step is performed on the semiconductor substrate 210 to form a planarized semiconductor substrate 210'. The planarized semiconductor substrate 210' is also referred as a pre-thin semiconductor substrate 210'. In some embodiments, a thickness T210' of the planarized semiconductor substrate 210' may approximately range from about 30 μm to about 200 μm. In some embodiments, the planarizing step may include a grinding process or a CMP process. After the planarizing step, a cleaning step may be optionally performed, for example to clean and remove the residue generated from the planarizing step. However, the disclosure is not limited thereto, and the planarizing step may be performed through any other suitable method.

In some embodiments, as shown in FIG. 1E, prior to the planarizing step of the semiconductor substrate 210, the semiconductor substrate 210 may be released from the support or temporary carrier, and a holding device AF1 is adopted to secure the planarized semiconductor substrate 110' for preventing any damages to the planarized semiconductor substrate 110' due to the planarizing step or any other subsequent process(es). For example, the holding device AF1 may be an adhesive tape, an adhesive carrier or a suction pad, the disclosure is not limited thereto.

Figure 1F:
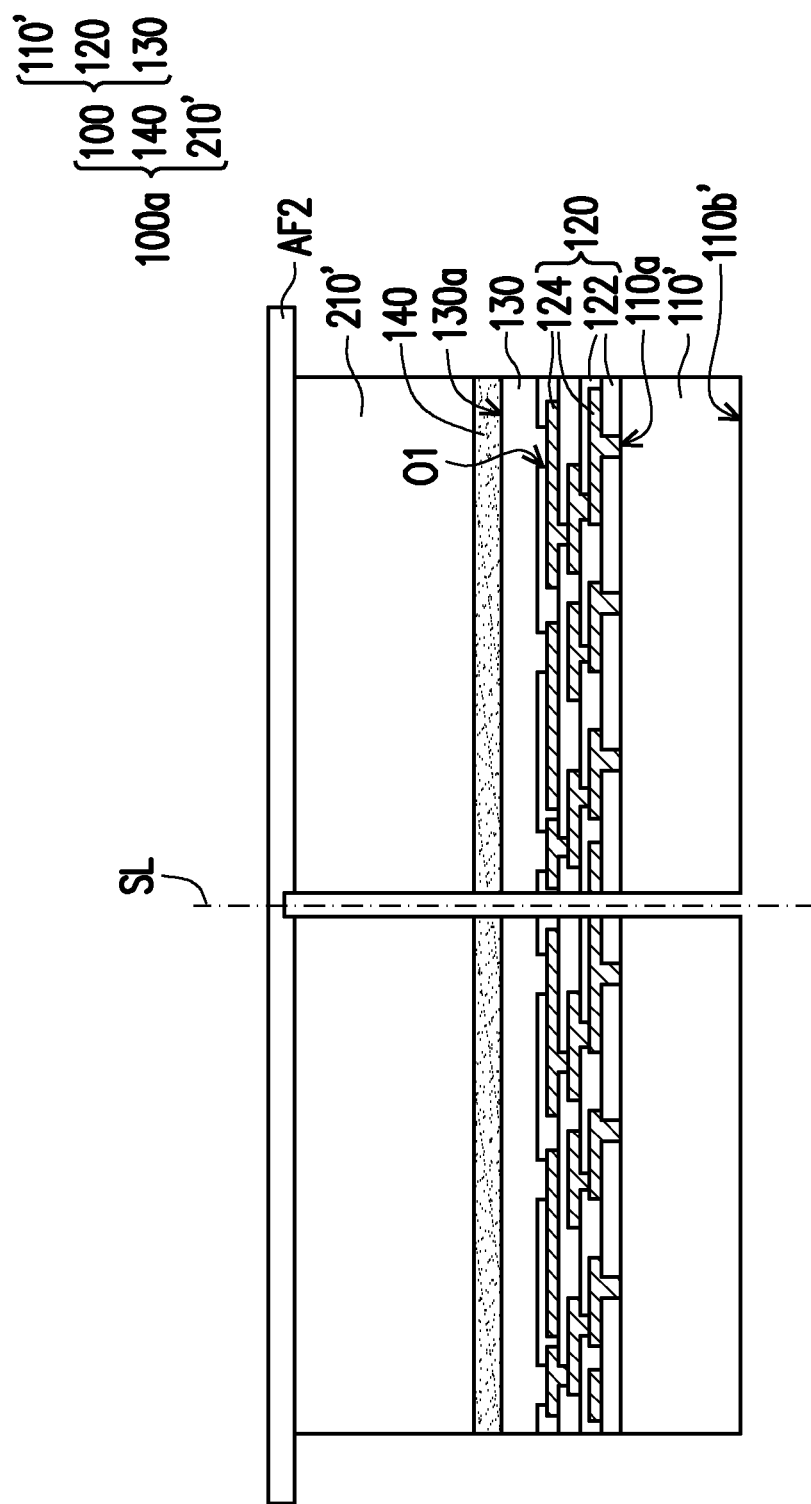

Referring to FIG. 1F, in some embodiments, a singulation (dicing) process is performed to cut the planarized semiconductor substrate 110', the interconnection structure 120, the passivation layer 130, the bonding layer 140 and the planarized semiconductor substrate 210' so as to form a plurality of semiconductor components 100a. In some embodiments, prior to the singulation (dicing) process, the planarized semiconductor substrate 110' is released from the holding device AF1 and thus is exposed; and then, the singulation (dicing) process is performed, where the planarized semiconductor substrate 110', the interconnection structure 120, the passivation layer 130, the bonding layer 140 and the planarized semiconductor substrate 210' are cut along a scribe line SL (indicated by a dotted line) to form the semiconductor components 100a (also referred as the singulated semiconductor components 100a). In one embodiment, the singulation (dicing) process is a wafer dicing process or a wafer singulation process, which may include mechanical sawing or laser cutting. The disclosure is not limited thereto. During the wafer dicing process, the planarized semiconductor structure 210' functions as a supporting element of the integrated circuit component 100 to avoid the integrated circuit component 100 being broken.

In certain embodiments, as shown in FIG. 1F, a holding device AF2 is adopted to secure the planarized semiconductor structure 210' for preventing any damages to the planarized semiconductor substrate 110' due to the singulation (dicing) process. In one embodiment, during the singulation (dicing) process, the holding device AF2 may be partially cut, as shown in FIG. 1F. In an alternative embodiment (not shown), the holding device AF2 may not be cut during the singulation (dicing) process, the disclosure is not limited thereto. For example, the holding device AF2 may be an adhesive tape, an adhesive carrier or a suction pad, the disclosure is not limited thereto. In one embodiment, the holding device AF2 may be the same as the holding device AF1. In an alternative embodiment, the holding device AF2 may be different from the holding device AF1.

Figure 1G:
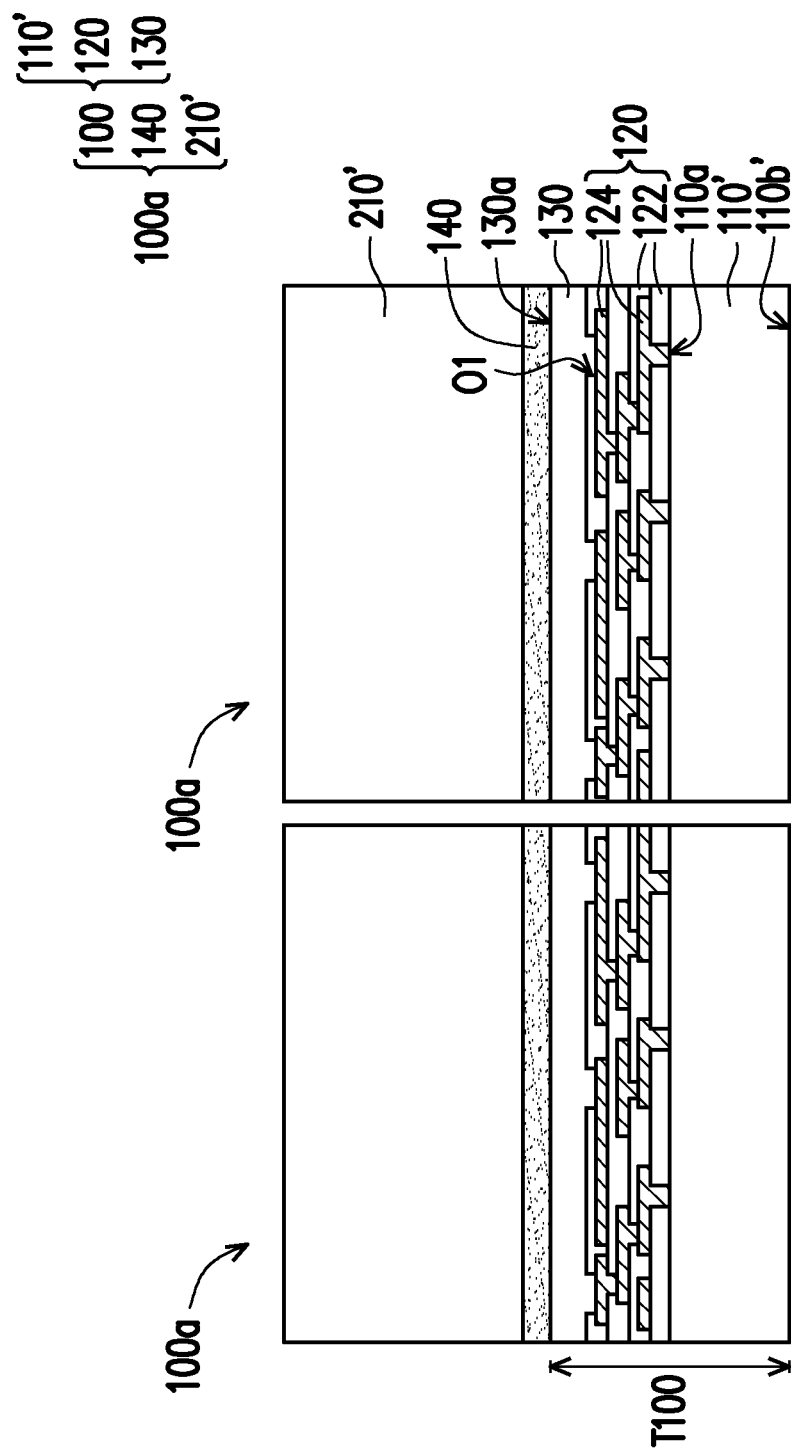

Referring to FIG. 1G, in some embodiments, after performing the singulation (dicing) process, the holding device AF2 is removed. As shown in FIG. 1G, the singulated semiconductor components 100a are released from the holding device AF2, and are referred as individual and separate semiconductor components 100a.

In some embodiments, as shown in FIG. 1G, each one of the singulated semiconductor components 100a includes the integrated circuit component 100 (including the planarized semiconductor substrate 110', the interconnection structure 120 disposed on the planarized semiconductor substrate 110' and the passivation layer 130 covering the interconnection structure 120), the planarized semiconductor substrate 210' disposed over the integrated circuit component 100, and the bonding layer 140 disposed between the integrated circuit component 100 and the planarized semiconductor structure 210'. As shown in FIG. 1G, for example, the planarized semiconductor structure 210' is adhered to (e.g. bonded to) the passivation layer 130 of the integrated circuit component 100 through the bonding layer 140 by performing a fusion bonding process. In some embodiments, the thickness T100 of the integrated circuit component 100, which is included in each one of the singulated semiconductor components 100a, may approximately range from about 5 μm to about 50 μm. In some embodiments, a thickness T110' of the planarized semiconductor substrate 110' may approximately range from about 3 μm to about 30 μm. Due to the aforementioned manufacturing method, the thickness T100 of the integrated circuit component 100 of each one of the singulated semiconductor components 100a can be greatly reduced, thereby providing better flexibility in the size dimension of the integrated circuit component 100 in semiconductor components 100a.

FIG. 2A to FIG. 2H are schematic cross sectional views of various stages in a method of manufacturing a package structure according to some exemplary embodiments of the present disclosure. In exemplary embodiments, the manufacturing method is part of a packaging process at a wafer level. In FIG. 2A to FIG. 2H, a package structure 10 is shown to represent a package structure obtained following the manufacturing method, for example. In some embodiments, two semiconductor components or chips are shown to represent plural devices or chips, and one or more packages structure are shown to represent plural package structures of a wafer following the semiconductor manufacturing method, the disclosure is not limited thereto.

Figure 2A:
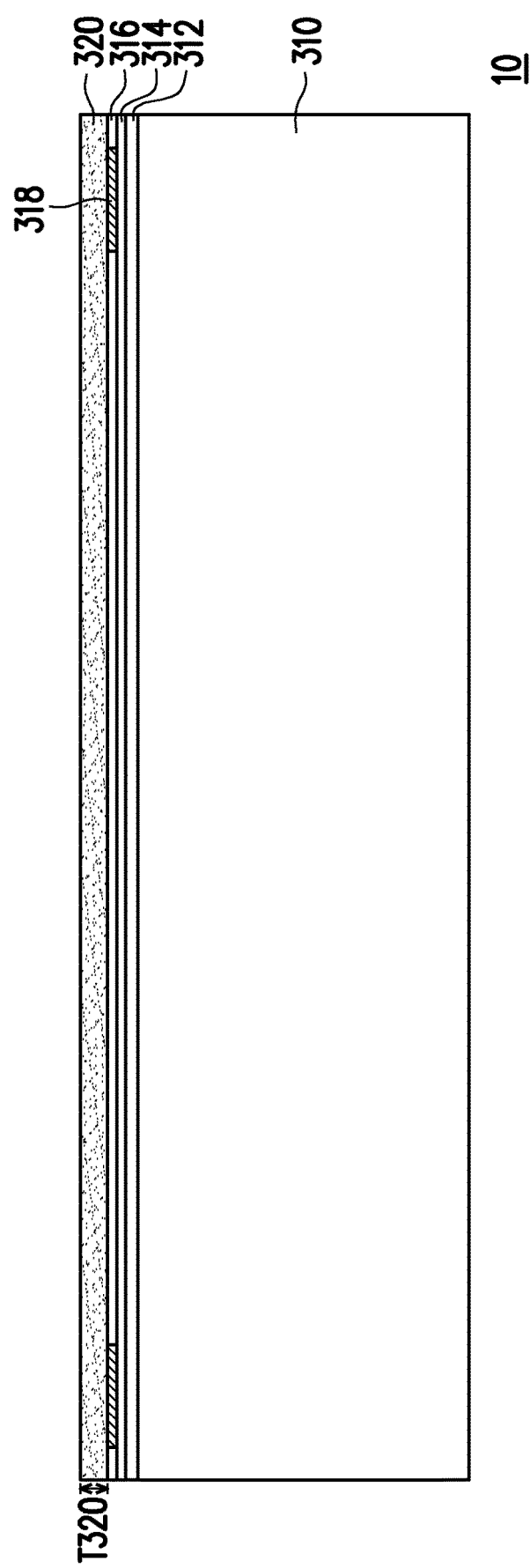
FIG. 2A to FIG. 2H are schematic cross sectional views of various stages in a method of manufacturing a package structure according to some exemplary embodiments of the present disclosure.

Referring to FIG. 2A, in some embodiments, a semiconductor substrate 310 is provided upon which an interlayer dielectric layer 312, an interlayer dielectric layer 314, and an alignment layer 316 are stacked. As shown in FIG. 2A, the semiconductor substrate 310 has a top surface 310a and a bottom surface 310b opposite to the top surface 310a. In some embodiments, the semiconductor substrate 310 is a bare silicon substrate. In one embodiment, the semiconductor substrate 310 may be a silicon substrate including active components (e.g., transistors or the like) and/or passive components (e.g., resistors, capacitors, inductors or the like) formed therein. In an alternative embodiment, the semiconductor substrate 310 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

As shown in FIG. 2A, the interlayer dielectric layer 312 is disposed on the top surface 310a of the semiconductor substrate 310, and the interlayer dielectric layer 314 is disposed on the interlayer dielectric layer 312. In other words, the interlayer dielectric layer 312 is sandwiched between the semiconductor substrate 310 and the interlayer dielectric layer 314, for example. In some embodiments, the interlayer dielectric layer 312 and the interlayer dielectric layer 314 may be formed by suitable fabrication techniques such as vapor deposition, spin coating, atomic layer deposition (ALD), thermal oxidation, some other suitable deposition or growth process, or a combination of the foregoing. The vapor deposition may include, for example, chemical vapor deposition (CVD), physical vapor deposition (PVD), some other suitable vapor deposition process, or a combination of the foregoing. In one embodiment, a material of the interlayer dielectric layer 312 is different from a material of the interlayer dielectric layer 314. For example, the material of the interlayer dielectric layer 132 may include phosphosilicate glass (PSG) while the material of the interlayer dielectric layer 134 may include a nitride such as silicon nitride. However, the disclosure is not limited thereto.

In an alternative embodiment, the materials of the interlayer dielectric layer 312 and the interlayer dielectric layer 314 may be the same. For example, the interlayer dielectric layer 132 and the interlayer dielectric layer 134 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like. Due to the presence of the interlayer dielectric layer 312 and/or the interlayer dielectric layer 314, a surface having a high degree of planarity and flatness can be provided, which is beneficial to the formations of later-formed layers, thereby improving the reliability of the package structure. However, the disclosure is not limited thereto, in a further alternative embodiment, as the top surface 310a of the semiconductor substrate 310 has a high degree of planarity and flatness, which is beneficial to the formation of the later-formed layer(s), the interlayer dielectric layer 312 and/or the interlayer dielectric layer 314 may be optionally omitted.

Continued on FIG. 2A, in some embodiments, the alignment layer 316 disposed on the semiconductor substrate 310 has a plurality of alignment marks 318. As shown in FIG. 2A, for example, the alignment layer 316 is formed on the interlayer dielectric layer 314, where the interlayer dielectric layer 314 is located between the interlayer dielectric layer 312 and the alignment layer 316. In some embodiments, the alignment marks 318 are arranged on a periphery region which surrounds a positioning location of later-disposed semiconductor component(s) (e.g. the semiconductor component(s) 100a depicted in FIG. 1G). In the other words, the alignment marks 318 are disposed within a region aside of a location where the semiconductor component(s) disposed on. In some embodiments, the alignment layer 136 may be a silicon oxide layer, a silicon nitride layer, a silicon oxynitride layer, or a dielectric layer formed by other suitable dielectric materials, where the alignment layer 136 may be formed by deposition or the like. In some embodiments, the alignment marks 318 may be a patterned copper layer or other suitable patterned metal layer, where the alignment marks 318 may be formed by electroplating or deposition. The disclosure is not limited thereto. The shapes and numbers of the alignment marks 318 are not limited in the disclosure, and may be designated based on the demand and/or design layout.

As shown in FIG. 2A, in some embodiments, a top surface 316a of the alignment layer 316 is substantially levelled with top surfaces 318a of the alignment marks 318. In other words, the top surface 316a of the alignment layer 316 is coplanar to the top surfaces 318a of the alignment marks 318, for example; and thus, there is a high degree of coplanarity between the top surface 316a of the alignment layer 316 and the top surfaces 318a of the alignment marks 318. Due to the high degree of coplanarity and flatness, the formation of the later-formed layer(s) is beneficial. With the presence of the alignment layer 316 (e.g. the alignment marks 138), the accuracy of transferring the later disposed semiconductor component(s) onto the semiconductor substrate 310 can be improved. Note that, the alignment marks 318 are electrically isolated from other components in the package structure 10. However, the disclosure is not limited thereto, in an alternative embodiment, with or without the presences of the interlayer dielectric layer 312 and the interlayer dielectric layer 314, the alignment layer 316 having the alignment marks 318 may be optionally omitted based on the layout design.

Continued on FIG. 2A, in some embodiments, a bonding layer 320 is formed on the alignment layer 136 and over the semiconductor substrate 310. As shown in FIG. 2A, the bonding layer 320 is a smooth layer having a continuous even surface and overlaid on the alignment layer 316 and the alignment marks 318, for example. In other words, the bonding layer 320 is formed in a form of a blanket layer covering the top surface 316a of the alignment layer 316 and the top surfaces 318a of the alignment marks 318 and disposed thereon. In certain embodiments, as shown in FIG. 2A, the bonding layer 320 entirely covers the top surface 316a of the alignment layer 316 and the top surfaces 318a of the alignment marks 318. In some embodiments, a material of the bonding layer 320 may be made of silicon oxynitride (SiON), silicon oxide, silicon nitride or the like, and may be formed by deposition or the like. In some embodiments, a thickness T320 of the bonding layer 320 may approximately range from about 100 Å to about 100 kÅ. Due to the high degree of coplanarity and flatness provided by the disposing surface of the underlying component (e.g., the top surface 316a of the alignment layer 316 and the top surfaces 318a of the alignment marks 318), the bonding layer 320 is capable of having a substantially uniform and even thickness.

Figure 2B:
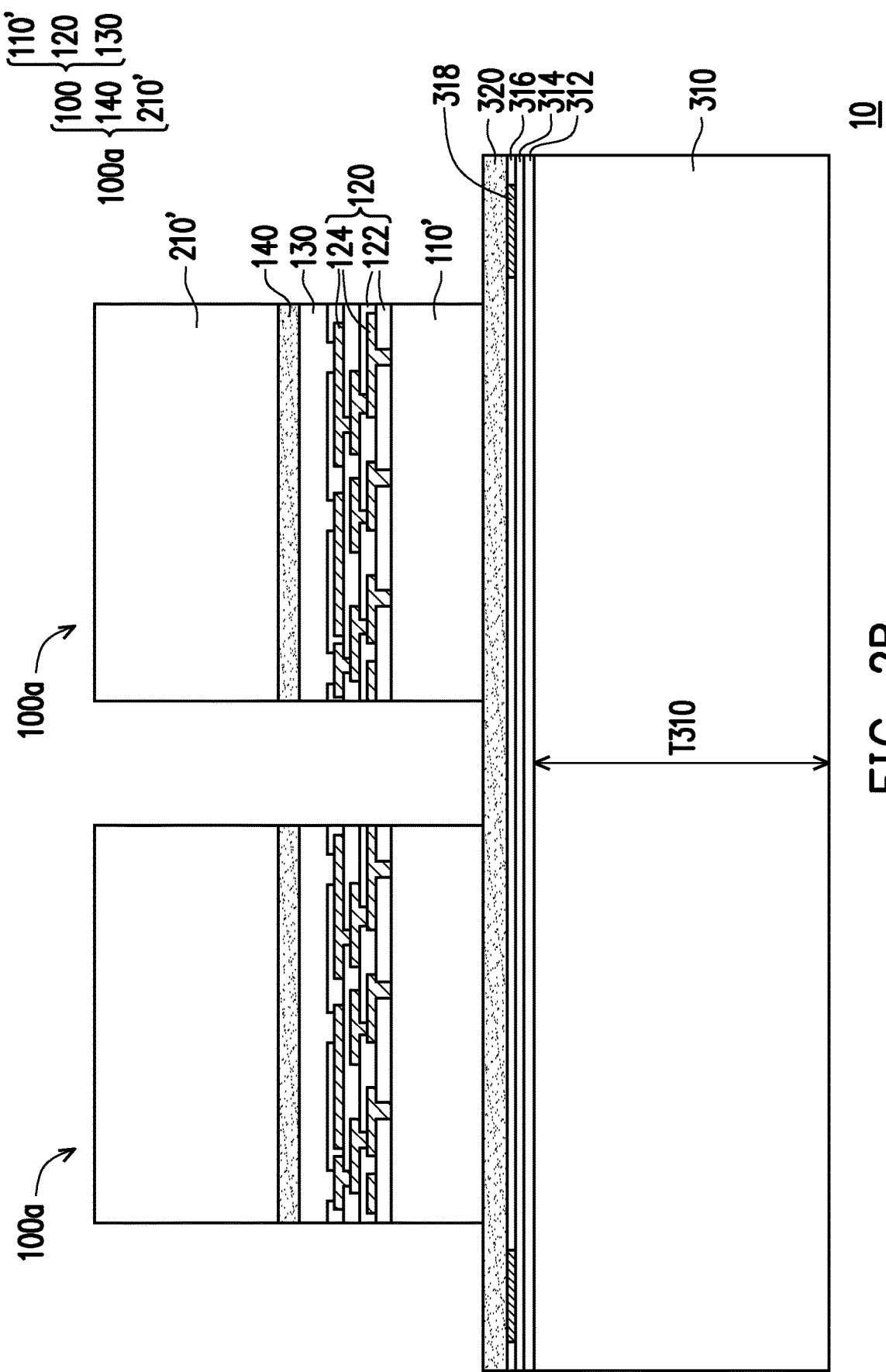

Referring to FIG. 2B, in some embodiments, one or more semiconductor components are provided, and are disposed over the semiconductor substrate 310 and on the bonding layer 320. For illustration purpose, only two semiconductor components are shown in FIG. 2B, for example. However, the number of the semiconductor components may be more than two or less than two based on the demand and/or design layout, the disclosure is not limited thereto.

In one embodiment, the semiconductor components provided on the semiconductor substrate 310 may be identical. For example, as shown in FIG. 2B, the semiconductor components provided on the semiconductor substrate 310 are the semiconductor components 100*a* depicted in FIG. 1G. In some embodiments, each one of the semiconductor components 100*a* includes the integrated circuit component 100 (including the planarized semiconductor substrate 110', the interconnection structure 120 disposed on the planarized semiconductor substrate 110' and the passivation layer 130 covering the interconnection structure 120), the planarized semiconductor substrate 210' disposed over the integrated circuit component 100, and the bonding layer 140 disposed between the integrated circuit component 100 and the planarized semiconductor structure 210'. The planarized semiconductor structure 210' is adhered to (e.g. bonded to) the passivation layer 130 of the integrated circuit component 100 through the bonding layer 140 by fusion bonding. The certain details or descriptions of the semiconductor components 100*a* can be referred to FIG. 1A to FIG. 1G, and will not be repeated herein for simplicity. As shown in FIG. 2B, in some embodiments, the semiconductor components 100*a* are in contact with a portion of the bonding layer 320, and the bonding layer 320 is located between the semiconductor components 100*a* and the alignment layer 316 disposed on the semiconductor substrate 310. In certain embodiments, through the bonding layer 320, the semiconductor components 100*a* are bonded to the alignment layer 316 disposed on the semiconductor substrate 310 by fusion bonding. For example, the fusion bonding process may include a hydrophilic fusion bonding process, where a workable temperature is approximately greater than or substantially equal to about 100° C. and a workable pressure is approximately greater than or substantially equal to about 1 kg/cm$^2$; however, the disclosure is not specifically limited thereto. Owing to the bonding layer 320, the integrated circuit components 100 of the semiconductor components 100*a* and the semiconductor substrate 310 are thermally coupled, such that the heat generated by the integrated circuit components 100 of the semiconductor components 100*a* may be dissipated through the semiconductor substrate 310, such that the heat dissipation efficiency of the package structure 10 can be controlled by adjusting a thickness T310 of the semiconductor substrate 310. In other words, due to the presence of the semiconductor substrate 310, thermal and mechanical properties of the package structure 10 can be ensured.

However, the disclosure is not limited thereto; in an alternative embodiment, based on the demand and/or design layout (such as, a function integration), the semiconductor components provided on the semiconductor substrate 310 may be different from each other. For example, the configurations of the different semiconductor components provided on the semiconductor substrate 310 may be similar to the configuration of the semiconductor component 100*a* depicted in FIG. 1G, but the planarized semiconductor substrates respectively included in the different semiconductor components may have different active components and/or different passive components.

In a further alternative embodiment (not show), based on the demand and/or design layout (such as, a function integration), one or more additional semiconductor component(s) having compatible dimensions (now shown) may also be provided, and be disposed on the semiconductor substrate 310 and aside of the semiconductor components provided on the semiconductor substrate 310. For example, the additional semiconductor component(s) may include memory or the like, the disclosure is not further limited.

Figure 2C:
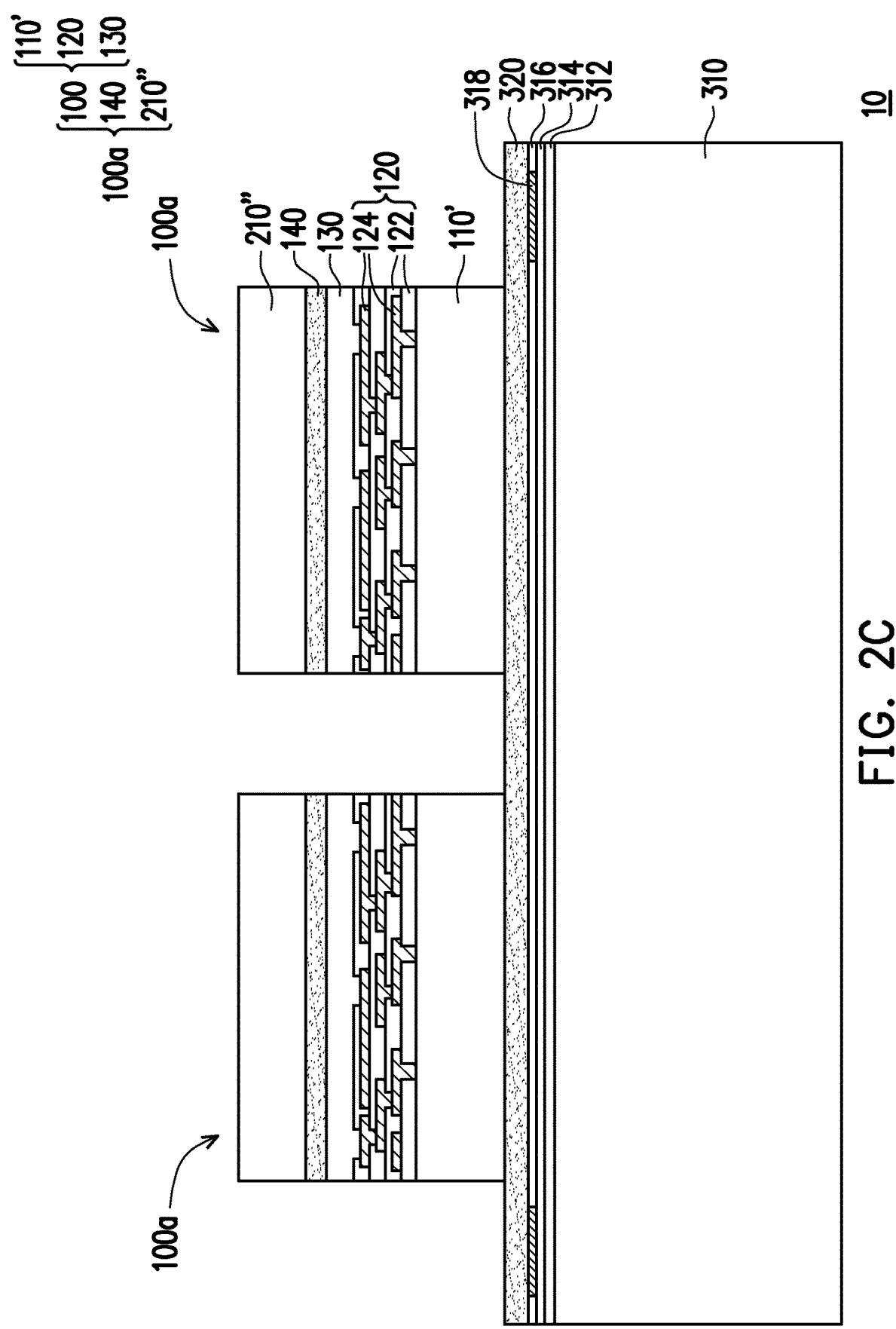

Referring to FIG. 2C, in some embodiments, a planarizing step is perform on the planarized semiconductor substrate 210' to form a thin semiconductor substrate 210". In some embodiments, a thickness T210" of the thin semiconductor substrate 210" may approximately range from about 3 μm to about 10 μm. In some embodiments, the planarizing step may include a grinding process or a CMP process. After the planarizing step, a cleaning step may be optionally performed, for example to clean and remove the residue generated from the planarizing step. However, the disclosure is not limited thereto, and the planarizing step may be performed through any other suitable method.

Figure 2D:
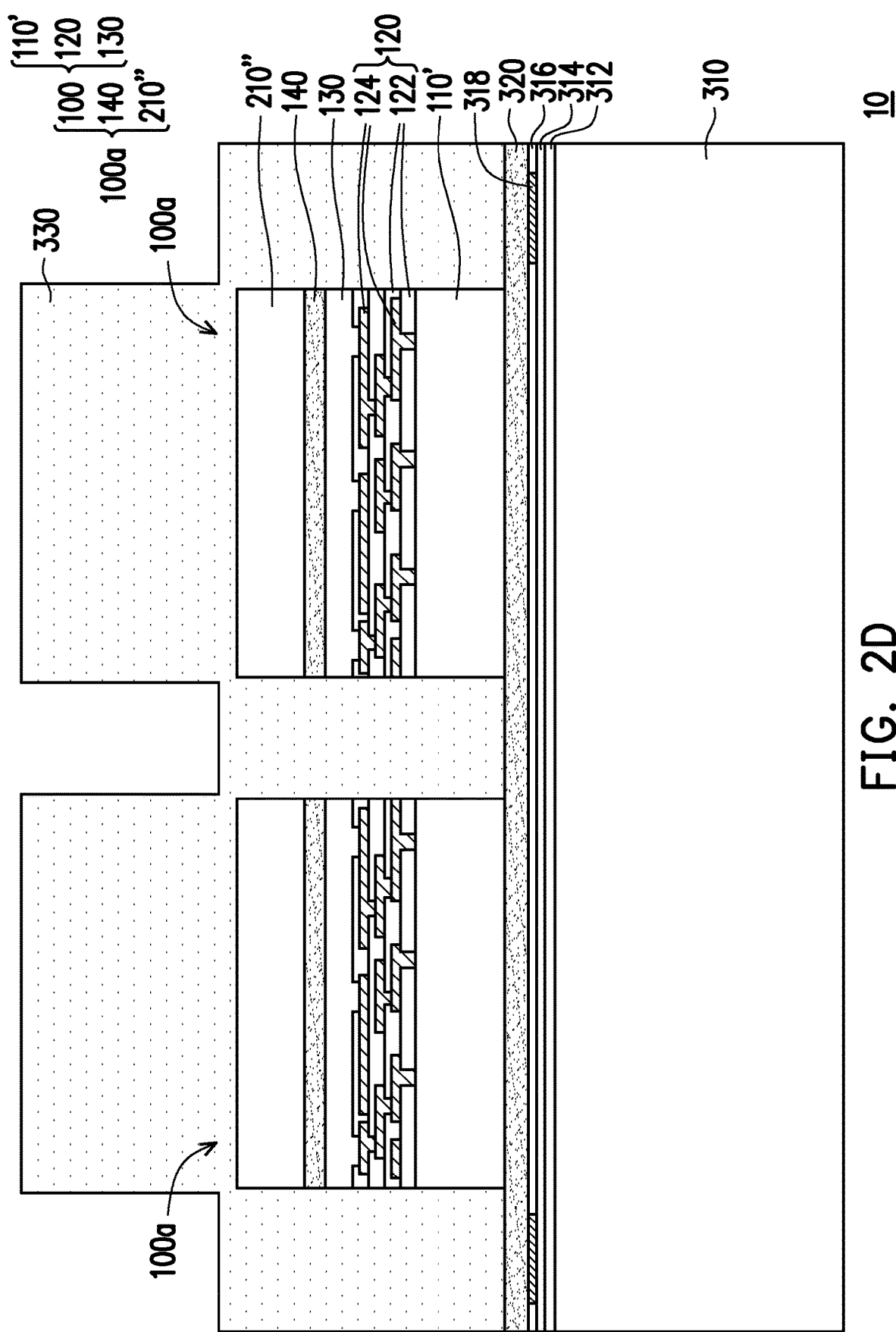

Referring to FIG. 2D, in some embodiments, an insulating encapsulation 330 is formed over the semiconductor substrate 310. As shown in FIG. 2D, the insulating encapsulation 330 is conformally formed on the bonding layer 320 and the semiconductor components 100*a*, where the semiconductor components 100*a* and a portion of the bonding layer 320 exposed by the semiconductor components 100*a* are covered by the insulating encapsulation 330. For example, a top surface and a sidewall of each of the semiconductor components 100*a* are physically contacted with the insulating encapsulation 330. In some embodiments, the insulating encapsulation 330 may be an oxide (such as silicon oxide or the like). In some embodiments, the insulating encapsulation 330 may be formed by CVD process.

Figure 2E:
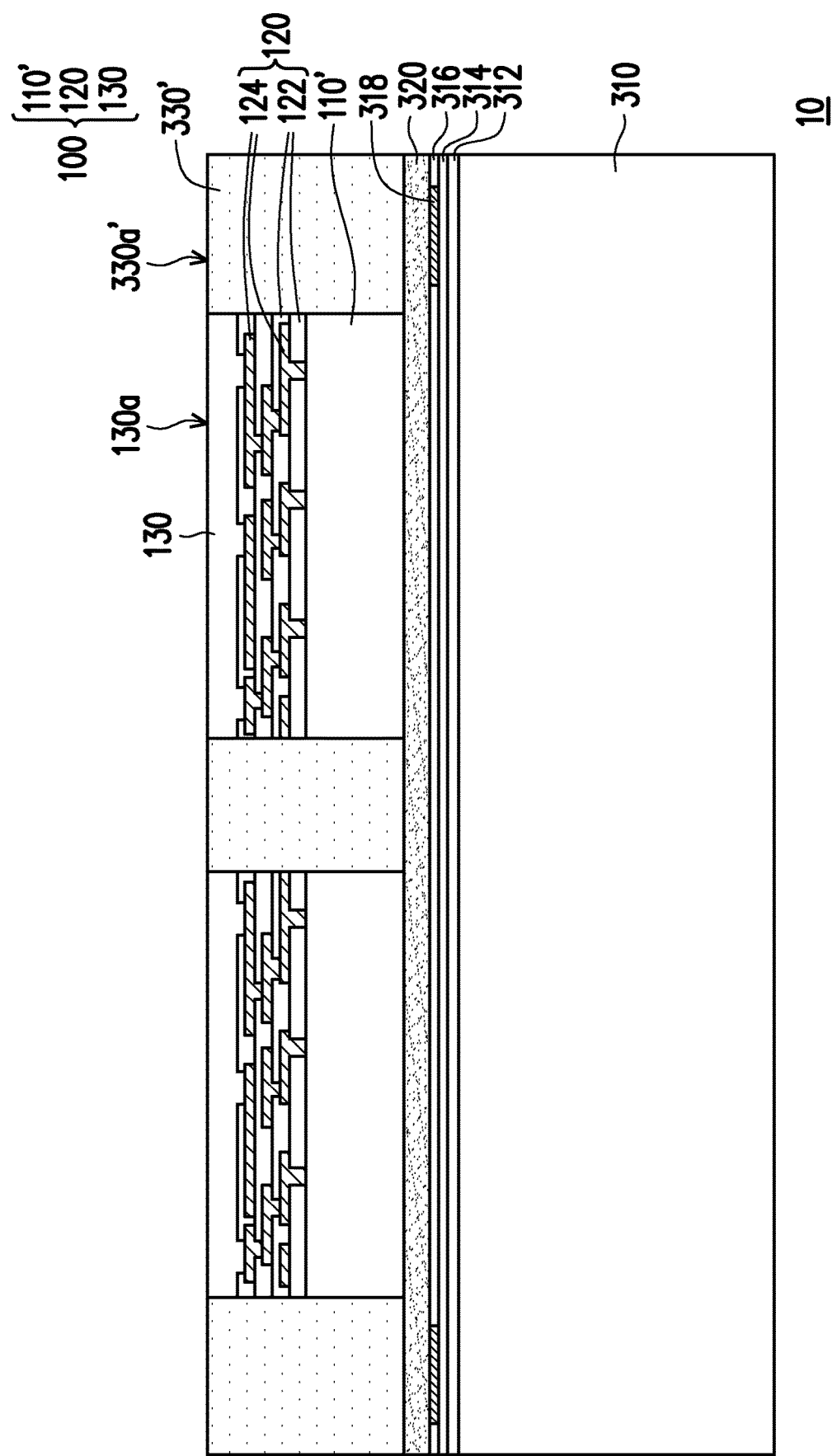

Referring to FIG. 2E, in some embodiments, a planarizing step is performed until the surface 130*a* of the passivation layer 130 in each of the integrated circuit components 100 is exposed. For example, the insulating encapsulation 330 and the semiconductor components 100*a* are planarized until the thin semiconductor substrate 210" and the bonding layer 140 of each one of the semiconductor components 100*a* and a portion of the insulating encapsulation 330 are removed and the integrated circuit components 100 (e.g. the passivation layers 130 of the integrated circuit components 100) are exposed by a surface 330*a'* of the planarized insulating encapsulation 330', as shown in FIG. 2E. That is, for example, after the planarizing step, the thin semiconductor substrate 210" and the bonding layer 140 of each of the semiconductor components 100*a* are removed and only the integrated circuit components 100 are left on the semiconductor substrate 310, where the thickness T100 of each of the integrated circuit components 100 may approximately range from about 5 μm to about 50 μm.

In addition, the integrated circuit components 100 (e.g. the remained or non-removed parts of the semiconductor components 100*a* depicted in FIG. 2E, after the planarizing step) of the semiconductor components 100*a* are referred as semiconductor devices 100 having the thickness ranging approximately from about 3 μm to about 30 μm. For example, the integrated circuit components 100, which is also called the semiconductor devices 100, may be digital chips, analog chips or mixed signal chips, such as application-specific integrated circuit ("ASIC") chips, sensor chips, wireless and radio frequency (RF) chips, MEMS chips, CIS chips, pre-assembled packages, memory chips, logic chips or voltage regulator chips. The disclosure is not limited thereto.

In certain embodiments, as shown in FIG. 2E, the surface 130*a* of the passivation layer 130 in each of the integrated circuit components 100 is substantially levelled with the surface 330*a'* of the planarized insulating encapsulation 330', for example. In other words, the surface 130*a* of the passivation layer 130 in each of the integrated circuit components 100 is coplanar to the surface 330a' of the planarized insulating encapsulation 330'. In some embodiments, the planarizing step may include a grinding process or a CMP process. After the planarizing step, a cleaning step may be optionally performed, for example to clean and remove the residue generated from the planarizing step. However, the disclosure is not limited thereto, and the planarizing step may be performed through any other suitable method.

Figure 2F:
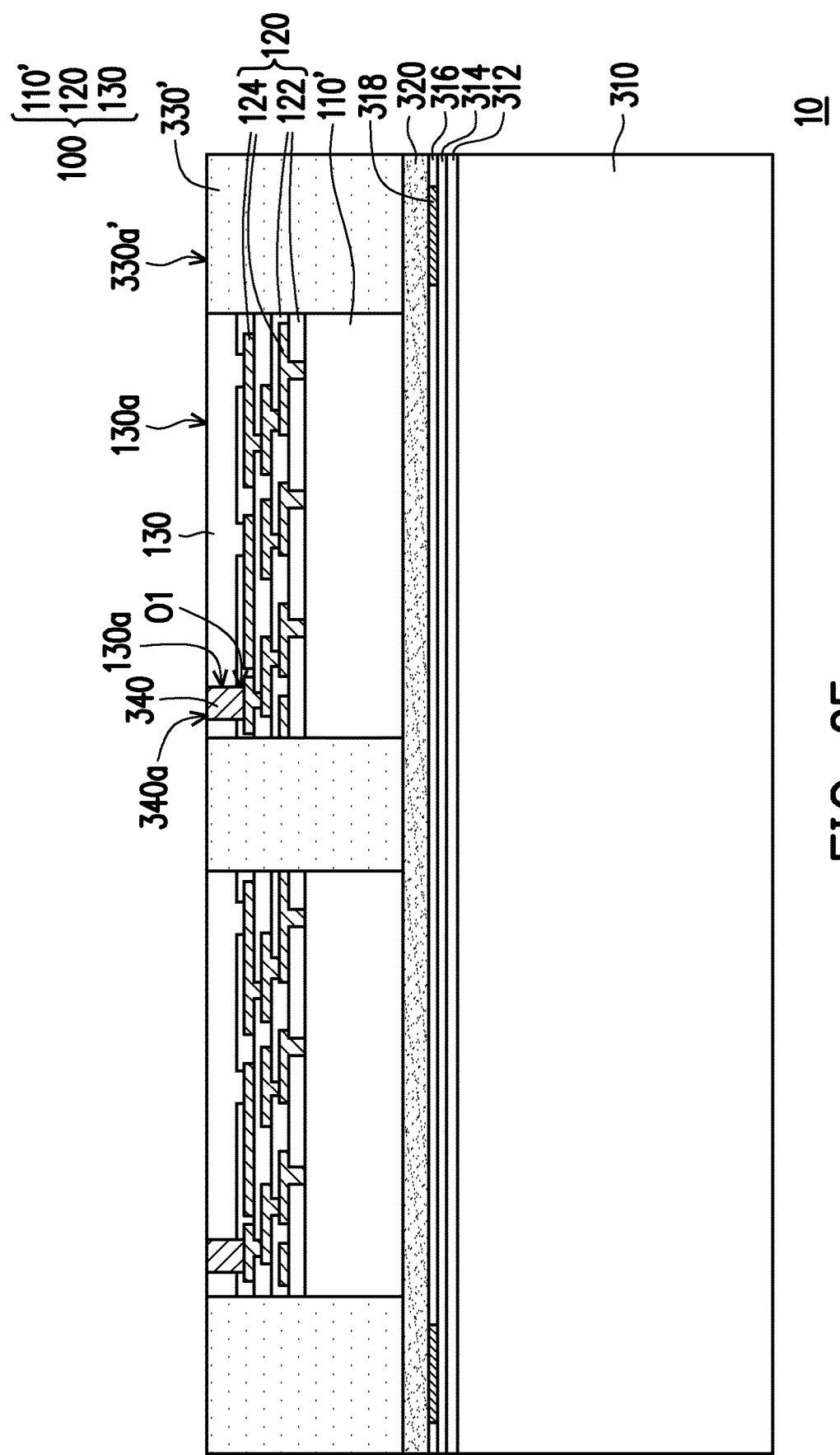

Referring to FIG. 2F, in some embodiments, one or more conductive pillars 340 are formed. For illustration purpose, only two conductive pillars 340 are shown in FIG. 2F, where one of the conductive pillars 340 is disposed in one of the integrated circuit components 100, for example. However, the number of the conductive pillars 340 disposed in each of the integrated circuit component 100 may be more than one based on the demand and/or design layout, the disclosure is not limited thereto.

In some embodiments, for each integrated circuit component 100, the conductive pillar 340 is formed in an opening 130a formed in the passivation layer 130 and one of the first openings O1 formed in the topmost layer of the inter-dielectric layers 122, where the opening 130a formed in the passivation layer 130 spatially communicated to one of the first openings O1 formed in the topmost layer of the inter-dielectric layers 122, as shown in FIG. 2F. In other words, each of the conductive pillars 340 penetrates the passivation layer 130 and the topmost layer of the inter-dielectric layers 122 of the interconnection structure 120 of the respective one integrated circuit component 100, and physically contacts the top surface of the topmost layer of the patterned conductive layers 124 exposed by the topmost layer of the inter-dielectric layers 122. In some embodiments, each of the conductive pillars 340 is electrically connected to the topmost layer of the patterned conductive layers 124 exposed by the topmost layer of the inter-dielectric layers 122.

In some embodiments, a sidewall (not marked) of each conductive pillar 340 is wrapped by the passivation layer 330 of the respective one integrated circuit component 100. In certain embodiments, top surfaces 340a of the conductive pillars 340 are substantially levelled with and coplanar to the top surface 130a of the passivation layer 130 of each integrated circuit component 100 and the surface 330a' of the planarized insulating encapsulation 330'. As shown in FIG. 2F, in certain embodiments, the top surfaces 340a of the conductive pillars 340, the surfaces 130a of the passivation layers 130 and the surface 330a' of the planarized insulating encapsulation 330' have a high degree of coplanarity and flatness, which is beneficial for the later-formed layers.

In some embodiments, as shown in FIG. 2F, for each interconnection structure 120, forming the conductive pillar 340 may include patterning the passivation layer 130 to form the opening 130a spatially communicated to a respective one of the first openings O1 formed in the topmost layer of the inter-dielectric layers 122, and then filling the metallization material (not shown) into the opening 130a and the respective first opening O1 to form the conductive pillar 340. In some embodiments, filling the metallization material may include performing a plating process (such as electroplating) or a deposition process. In one embodiment, the conductive pillars 340 may be copper, copper alloy, aluminum, aluminum alloy, or combinations thereof, where the conductive pillars 340 may be patterned using a photolithography and etching process. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The number of the conductive pillars 340 can be selected based on the demand and/or design layout. Furthermore, the numbers of the opening 130a and the first openings O1 may be adjusted in correspondence to the numbers of the conductive pillars 340. Note that, as mentioned above, the first openings O1 may be absent, and in such embodiment, the opening 130a simultaneously penetrates the passivation layer 130 and the topmost layer of the inter-dielectric layers 122 to expose a portion of the topmost layer of the patterned conductive layers 124. The disclosure is not limited thereto.

Figure 2G:
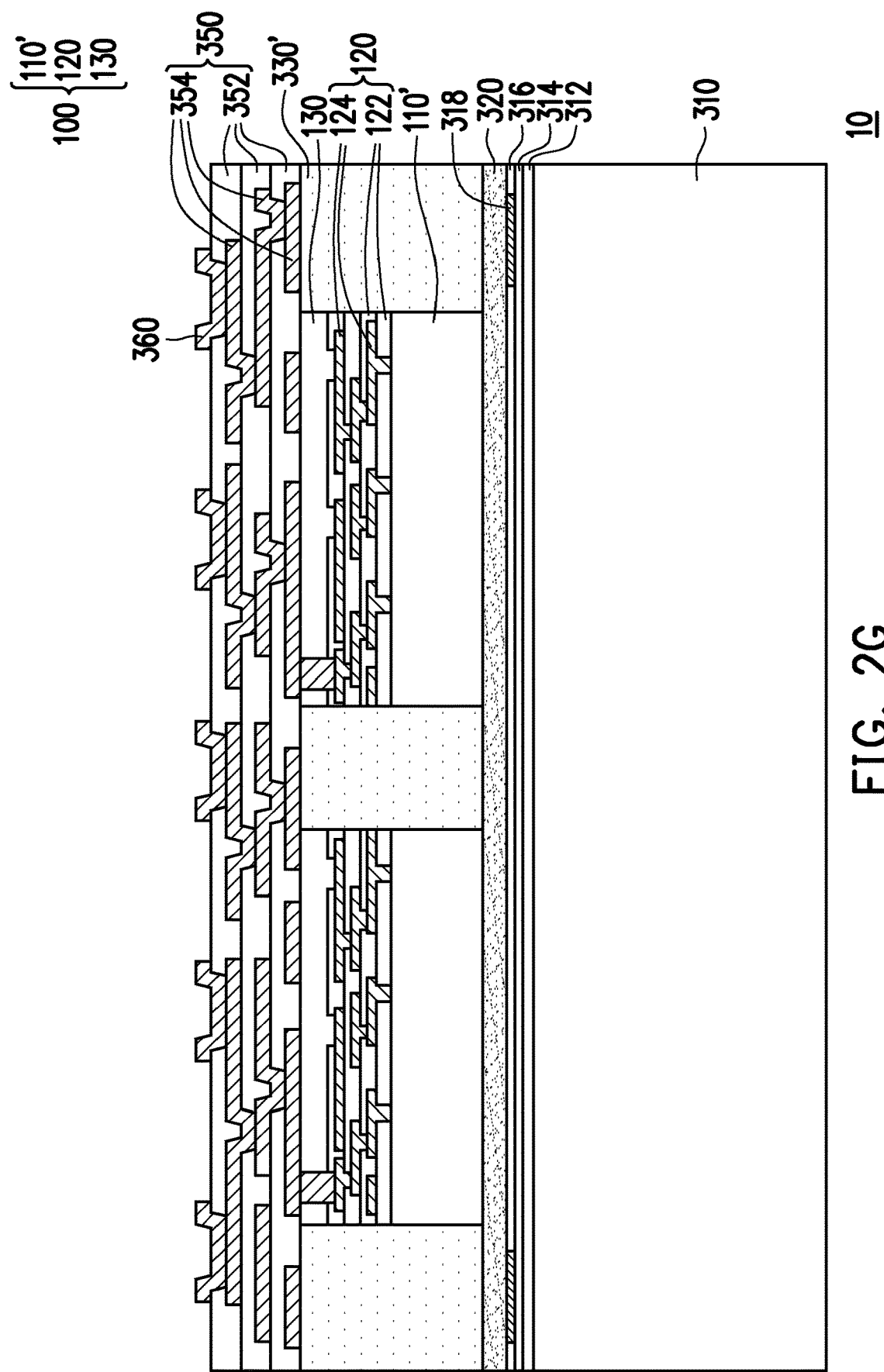

Referring to FIG. 2G, in some embodiments, a redistribution circuit structure 350 is formed on the planarized insulating encapsulation 330' and the integrated circuit components 100. In some embodiments, the redistribution circuit structure 350 is electrically connected to the integrated circuit components 100 via the conductive pillars 340. As shown in FIG. 2G, for example, the redistribution circuit structure 350 is a so-called front side redistribution circuit structure since the redistribution circuit structure 350 is fabricated at active sides (not marked) of the integrated circuit components 100. Through the redistribution circuit structure 350, the integrated circuit components 100 are electrically connected to each other. In other words, the integrated circuit components 100 communicate to one another through the presence of the redistribution circuit structure 350. The formation of the redistribution circuit structure 350 includes sequentially forming one or more polymer dielectric layers 352 and one or more metallization layers 354 in alternation. In certain embodiments, as shown in FIG. 2G, the metallization layers 354 are sandwiched between the polymer dielectric layers 352, but the top surface of the topmost layer of the metallization layers 354 is exposed by the topmost layer of the polymer dielectric layers 352, and the lowest layer of the metallization layers 352 is connected to the conductive pillars 340 of the integrated circuit components 100. The numbers of the layers of the polymer dielectric layers 352 and the metallization layers 354 may be less than or more than what is depicted in FIG. 2G, and may be designated based on the demand and/or design layout; the disclosure is not specifically limited thereto.

In some embodiments, the material of the polymer dielectric layers 352 includes polyimide, epoxy resin, acrylic resin, phenol resin, benzocyclobutene (BCB), polybenzooxazole (PBO), or any other suitable polymer-based dielectric material, and the polymer dielectric layers 352 may be formed by deposition. In some embodiments, the material of the metallization layers 354 includes aluminum, titanium, copper, nickel, tungsten, and/or alloys thereof, and the metallization layers 354 may be formed by electroplating or deposition. In certain embodiments, as the underlying planarized insulating encapsulation 330' and the integrated circuit components 100 (e.g. the conductive pillars 340 and the passivation layers 130) provide better planarization and evenness, the later-formed redistribution circuit structure 350, especially the metallization layers with thin line width or tight spacing, can be formed with uniform line-widths or even profiles over the planar and level insulating encapsulation 330' and the integrated circuit components 100, resulting in improved line/wiring reliability. For example, the pitch of the redistribution circuit structure 350 may be approximately less than or substantially equal to 0.8 µm.

Continued on FIG. 2G, in some embodiments, a plurality of under-ball metallurgy (UBM) patterns 360 is disposed on portions of the top surface of the topmost layer of the metallization layers 354 exposed by the topmost layer of the polymer dielectric layers 352 for electrically connecting with later-formed or later-disposed conductive elements (e.g. conductive balls). In some embodiments, the materials of the UBM patterns 360 may include copper, nickel, titanium, tungsten, or alloys thereof or the like, and may be formed by an electroplating process, for example. The shape and number of the UBM patterns 360 are not limited in this disclosure.

In an alternative embodiment, the UBM patterns 360 may be optionally omitted based on demand and/or design layout. In such embodiment, parts of the topmost layer of the metallization layers 354 underlying the later-formed or later-disposed conductive elements function as under-ball metallurgy (UBM) layers. In some embodiments, prior to forming or disposing the later-formed or later-disposed conductive elements, a solder paste (not shown) or flux is applied, so that the later-formed or later-disposed conductive elements are better fixed to the topmost layer of the metallization layers 354.

In a further alternative embodiment, besides the formation of the UBM patterns 360, additional conductive pad(s) (not shown) may be also formed for mounting passivation components. In such embodiment, the materials of the conductive pads and the UBM patterns 360 may be the same. In one embodiment, the material of the UBM patterns 360 may be different from the material of the conductive pads. The disclosure is not limited thereto.

Figure 2H:
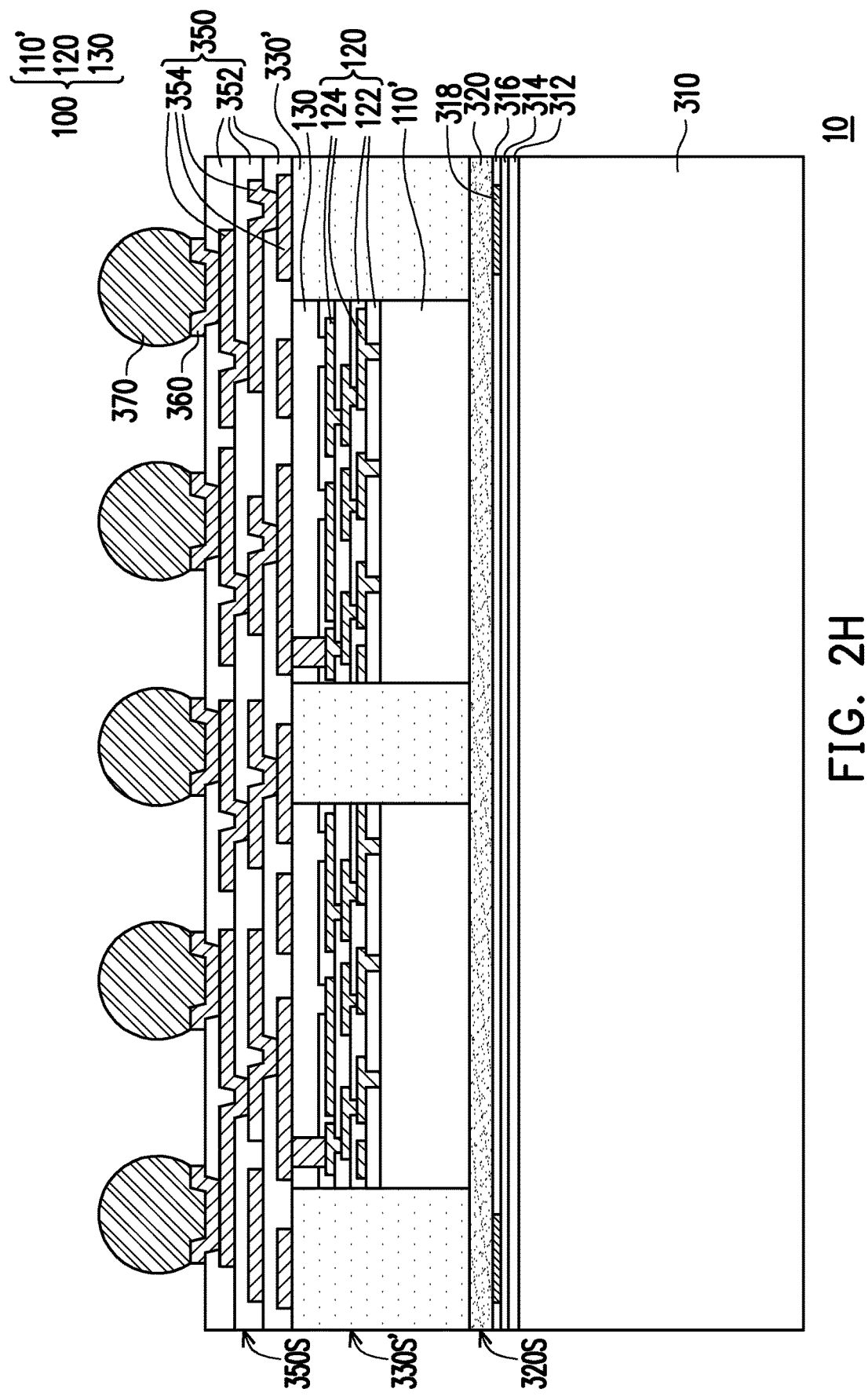

Referring to FIG. 2H, in some embodiments, after the redistribution circuit structure 350 is formed, a plurality of conductive elements 370 is formed on the redistribution circuit structure 350 and electrically connected to the redistribution circuit structure 350 through the UBM patterns 360. In some embodiments, the redistribution circuit structure 350 is located between the integrated circuit components 100 and the conductive elements 370 and between the planarized insulating encapsulation 330' and the conductive elements 370. As shown in FIG. 2H, the conductive elements 370 are physically connected to the UBM patterns 360. In some embodiments, the conductive elements 370 are electrically connected to the redistribution circuit structure 350 through the UBM patterns 360. In some embodiments, some of the conductive elements 370 are electrically connected to the integrated circuit components 100 through the UBM patterns 360, the redistribution circuit structure 350, and the conductive pillars 340. In some embodiments, the conductive elements 370 may be disposed on the UBM patterns 360 by ball placement process or reflow process. In some embodiments, the conductive elements 370 may be solder balls or ball grid array (BGA) balls. The disclosure is not limited thereto. The numbers of the conductive elements 370 may correspond to the numbers of the UBM patterns 360.

As shown in FIG. 2H, after the conductive elements 370 are formed, a formation of the package structure 10 is accomplished. In some embodiments, a singulation (dicing) process is performed to cut the wafer having a plurality of the package structures 10 into individual and separate package structures 10. In one embodiment, the singulation (dicing) process is a wafer dicing process or a wafer singulation process including mechanical sawing or laser cutting. In some embodiments, as shown in FIG. 2H, a sidewall 320S of the bonding layer 320 is aligned with a sidewall 330S' of the planarized insulating encapsulation 330' and a sidewall 350S of the redistribution circuit structure 350.

According to some embodiments, a package structure includes a semiconductor substrate, a bonding layer, at least one semiconductor device, a redistribution circuit structure and an insulating encapsulation. The bonding layer is disposed on the semiconductor substrate. The at least one semiconductor device is disposed on and in contact with a portion of the bonding layer, wherein the bonding layer is located between the semiconductor substrate and the at least one semiconductor device and adheres the at least one semiconductor device onto the semiconductor substrate. The redistribution circuit structure is disposed on and electrically connected to the at least one semiconductor device, wherein the at least one semiconductor device is located between the redistribution circuit structure and the bonding layer. The insulating encapsulation wraps a sidewall of the at least one semiconductor device, wherein a sidewall of the bonding layer is aligned with a sidewall of the insulating encapsulation and a sidewall of the redistribution circuit structure.

According to some embodiments, a method for manufacturing a package structure is provided with following steps: providing a semiconductor substrate; forming a first bonding layer on the semiconductor substrate; disposing at least one semiconductor device on the semiconductor substrate; fusion bonding the at least one semiconductor device to the semiconductor substrate through a portion of the first bonding layer; forming an insulating encapsulation to at least wrap a sidewall of the at least one semiconductor device; performing a first planarizing step to planarize the insulating encapsulation; forming a redistribution circuit structure on the at least one semiconductor device and on the insulating encapsulation; and disposing conductive elements on the redistribution circuit structure.

According to some embodiments, a method for manufacturing a semiconductor component is provided with following steps: providing a first semiconductor carrier; forming a bonding layer on the first semiconductor carrier; disposing a second semiconductor carrier on the first semiconductor carrier; fusion bonding the second semiconductor carrier to the first semiconductor carrier through the bonding layer; performing a first planarizing step on the first semiconductor carrier; performing a second planarizing step on the second semiconductor carrier; and performing a dicing process.

According to some embodiments, a package structure includes a semiconductor substrate, a bonding layer, at least one semiconductor device, and an insulating encapsulation. The bonding layer is located on the semiconductor substrate. The at least one semiconductor device is disposed on the bonding layer, wherein the bonding layer is located between the semiconductor substrate and the at least one semiconductor device. The insulating encapsulation wraps a sidewall of the at least one semiconductor device, wherein a sidewall of the bonding layer is aligned with a sidewall of the insulating encapsulation.

According to some embodiments, a method for manufacturing a semiconductor component is provided with following steps: providing a semiconductor substrate; forming a first bonding layer on the semiconductor substrate; disposing a semiconductor device on the semiconductor substrate; fusion bonding the semiconductor device to the semiconductor substrate through the first bonding layer; encapsulating the semiconductor device by an insulating encapsulation; performing a first planarizing step to planarize the insulating encapsulation to expose a first surface of the semiconductor device; forming at least one conductive pillar at the first surface of the semiconductor device, the at least one conductive pillar being embedded in the semiconductor device and having a second surface exposed by and substantially coplanar to the first surface of the semiconductor device; forming a redistribution circuit structure on the semiconductor device and on the insulating encapsulation; and disposing the conductive elements on the redistribution circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a semiconductor substrate;
    a bonding layer, disposed on the semiconductor substrate;
    at least one semiconductor device, disposed on and in contact with a portion of the bonding layer, wherein the bonding layer is located between the semiconductor substrate and the at least one semiconductor device and adhering the at least one semiconductor device onto the semiconductor substrate;
    a redistribution circuit structure, disposed on and electrically connected to the at least one semiconductor device, wherein the at least one semiconductor device is located between the redistribution circuit structure and the bonding layer; and
    an insulating encapsulation, wrapping a sidewall of the at least one semiconductor device,
    wherein a sidewall of the bonding layer is aligned with a sidewall of the insulating encapsulation and a sidewall of the redistribution circuit structure.

2. The package structure of claim 1, further comprising:
    conductive elements, connected to the redistribution circuit structure, wherein the redistribution circuit structure is located between the at least one semiconductor device and the conductive elements.

3. The package structure of claim 1, wherein the at least one semiconductor device comprises a passivation layer, wherein a surface of the passivation layer is substantially levelled with and coplanar to a surface of the insulating encapsulation.

4. The package structure of claim 3, further comprising:
    at least one conductive pillar, penetrating the passivation layer of the at least one semiconductor device and electrically connected to the at least one semiconductor device, wherein a surface of the at least one conductive pillar is substantially levelled with and coplanar to the surface of the passivation layer, and the redistribution circuit structure is electrically connected to the at least one semiconductor device through the at least one conductive pillar.

5. The package structure of claim 1, wherein the bonding layer is a blanket layer overlying the semiconductor substrate.

6. The package structure of claim 1, wherein a material of the bonding layer comprises silicon oxynitride.

7. The package structure of claim 1, further comprising:
    a plurality of alignment marks, located between the semiconductor substrate and the bonding layer and electrically isolated from the redistribution circuit structure and the at least one semiconductor device.

8. The package structure of claim 1, wherein a thickness of the at least one semiconductor device is greater than or substantially equal to 20 µm and less than or substantially equal to 50 µm.

9. A method for manufacturing a package structure, comprising:
    providing a semiconductor substrate;
    forming a first bonding layer on the semiconductor substrate;
    disposing a semiconductor device on the semiconductor substrate;
    fusion bonding the semiconductor device to the semiconductor substrate through the first bonding layer;
    encapsulating the semiconductor device by an insulating encapsulation;
    performing a first planarizing step to planarize the insulating encapsulation to expose a first surface of the semiconductor device;
    forming at least one conductive pillar at the first surface of the semiconductor device, the at least one conductive pillar being embedded in the semiconductor device and having a second surface exposed by and substantially coplanar to the first surface of the semiconductor device;
    forming a redistribution circuit structure on the semiconductor device and on the insulating encapsulation; and
    disposing conductive elements on the redistribution circuit structure.

10. The method of claim 9, wherein prior to disposing the semiconductor device on the semiconductor substrate, the method further comprises:
    forming a semiconductor component having the semiconductor device, wherein forming the semiconductor component having the semiconductor device comprises:
        providing a first semiconductor carrier;
        forming a second bonding layer on the first semiconductor carrier;
        disposing a second semiconductor carrier on the first semiconductor carrier;
        fusion bonding the second semiconductor carrier to the first semiconductor carrier through the second bonding layer;
        performing a second planarizing step on the first semiconductor carrier;
        performing a third planarizing step on the second semiconductor carrier; and
        performing a dicing process.

11. The method of claim 10, wherein after disposing the semiconductor device on the semiconductor substrate and prior to encapsulating the semiconductor device by the insulating encapsulation, the method further comprising:
    performing a fourth planarizing step on the second semiconductor carrier of the semiconductor component having the semiconductor device.

12. The method of claim 10, wherein performing the first planarizing step to planarize the insulating encapsulation to expose a first surface of the semiconductor device further comprises:
    removing the second semiconductor carrier and the second bonding layer.

13. A method for manufacturing a package structure, comprising:

providing a semiconductor substrate with a first bonding layer formed thereon;
disposing a plurality of semiconductor devices on the semiconductor substrate;
adhering the plurality of semiconductor devices to the first bonding layer by fusion bonding;
conformally forming an insulating encapsulation over the plurality of semiconductor devices and the first bonding layer exposed by the plurality of semiconductor devices;
performing a first planarizing step to planarize the insulating encapsulation;
forming a redistribution circuit structure on the insulating encapsulation; and
disposing conductive balls on the redistribution circuit structure, wherein the redistribution circuit structure is located between the plurality of semiconductor devices and the conductive balls.

14. The method as claimed in claim 13, wherein the first bonding layer is formed on the semiconductor substrate in a manner of a blanket layer covering on the semiconductor substrate.

15. The method as claimed in claim 13, wherein conformally forming the insulating encapsulation comprises performing a chemical vapor deposition process to form the insulating encapsulation.

16. The method as claimed in claim 13, wherein adhering the plurality of semiconductor devices to the first bonding layer by fusion bonding comprises adhering the plurality of semiconductor devices to the first bonding layer through a hydrophilic fusion bonding process.

17. The method as claimed in claim 13, wherein performing the first planarizing step to planarize the insulating encapsulation comprises planarizing the insulating encapsulation and the plurality of semiconductor devices to accessibly reveal the plurality of semiconductor devices from the insulating encapsulation.

18. The method as claimed in claim 17, wherein after accessibly revealing the plurality of semiconductor devices from the insulating encapsulation, the method further comprises:
forming at least one conductive pillar embedded in each of the plurality of semiconductor devices, wherein a surface of the at least one conductive pillar is exposed from a respective one semiconductor device of the plurality of semiconductor devices, and the at least one conductive pillar electrically connects the respective one semiconductor device to the redistribution circuit structure.

19. The method as claimed in claim 13, wherein prior to conformally forming the insulating encapsulation and after adhering the plurality of semiconductor devices to the first bonding layer, the method further comprises:
performing a second planarizing step on the plurality of semiconductor devices to thin down an overall thickness of each of the plurality of semiconductor devices.

20. The method as claimed in claim 13, wherein after forming the redistribution circuit structure on the insulating encapsulation and prior to disposing the conductive balls on the redistribution circuit structure, the method further comprises:
forming a plurality of under-ball metallurgy patterns on the redistribution circuit structure, wherein the plurality of under-ball metallurgy patterns is located between the conductive balls and the redistribution circuit structure.

* * * * *